(12) United States Patent (10) Patent No.: US 12,635,468 B2
Nishihara et al. (45) Date of Patent: May 19, 2026

(54) HOLDING TOOL AND MANUFACTURING METHOD

(71) Applicant: Mitsubishi Gas Chemical Company, Inc., Tokyo (JP)

(72) Inventors: Yusaku Nishihara, Yokohama (JP);
Chisato Murata, Yokohama (JP);
Yuhei Hasuike, Yokohama (JP);
Nobuki Hirooka, Yokohama (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 885 days.

(21) Appl. No.: 17/765,781

(22) PCT Filed: Sep. 29, 2020

(86) PCT No.: PCT/JP2020/036861
§ 371 (c)(1),
(2) Date: Mar. 31, 2022

(87) PCT Pub. No.: WO2021/065897
PCT Pub. Date: Apr. 8, 2021

(65) Prior Publication Data
US 2024/0282615 A1 Aug. 22, 2024

(30) Foreign Application Priority Data
Oct. 1, 2019 (JP) ................................. 2019-181173

(51) Int. Cl.
*H10P 72/70* (2026.01)
*B29K 307/04* (2006.01)
(Continued)

(52) U.S. Cl.
CPC ................ *H10P 72/74* (2026.01); *B32B 1/00* (2013.01); *B32B 27/08* (2013.01); *B32B 27/20* (2013.01);
(Continued)

(58) Field of Classification Search
CPC ............. H01L 21/6835; H01L 21/6836; H01L 221/68327; B33Y 80/00;
(Continued)

(56) References Cited

U.S. PATENT DOCUMENTS 7,377,595 B1 * 5/2008 Okajima ................. B60B 1/041
301/58
2020/0207030 A1 7/2020 Mishima et al.
2021/0237352 A1 8/2021 Hirooka et al.

FOREIGN PATENT DOCUMENTS

JP 2000-301451 A 10/2000
JP 2007-062333 A 3/2007
(Continued)

OTHER PUBLICATIONS

International Preliminary Report on Patentability for PCT/JP2020/036861, completed Jul. 21, 2021, and English Translation submitted herewith (7 pages).

(Continued)

*Primary Examiner* — Camie S Thompson
(74) *Attorney, Agent, or Firm* — Fitch, Even, Tabin & Flannery LLP

(57) ABSTRACT

Proposed is a holding tool that satisfies physical properties of a flexural modulus in a circumferential direction of 50 GPa or more and a warpage of not more than 0.5 mm. The holding tool is configured using carbon fibers and a resin, has a substantially annular shape, and includes a first resin layer. In the first resin layer, the longitudinal direction of the fibers is aligned along the circumferential direction of the substantially annular shape.

21 Claims, 4 Drawing Sheets

(51) Int. Cl.

| | | |
|---|---|---|
| *B32B 1/00* | (2024.01) | |
| *B32B 27/08* | (2006.01) | |
| *B32B 27/20* | (2006.01) | |
| *B32B 27/28* | (2006.01) | |
| *B33Y 80/00* | (2015.01) | |

(52) U.S. Cl.

CPC .............. *B32B 27/28* (2013.01); *B33Y 80/00* (2014.12); *B29K 2307/04* (2013.01); *B32B 2250/40* (2013.01); *B32B 2250/42* (2013.01); *B32B 2262/106* (2013.01); *B32B 2307/202* (2013.01); *B32B 2307/7376* (2023.05); *B32B 2457/14* (2013.01); *H10P 72/7416* (2026.01)

(58) Field of Classification Search

CPC ........ B32B 2307/7376; B32B 2307/04; B32B 2307/202; B32B 1/00; B32B 27/08; B32B 27/20; B32B 27/28; B32B 2250/40; B32B 2250/42; B32B 2262/106; B32B 2457/14
USPC ............. 428/378, 292.1, 297.1, 297.4, 411.1
See application file for complete search history.

(56) References Cited

FOREIGN PATENT DOCUMENTS

| | | | |
|---|---|---|---|
| JP | 2007-222998 | A | 9/2007 |
| JP | 2008-044083 | A | 2/2008 |
| JP | 2008-300555 | A | 12/2008 |
| JP | 2013-106021 | A | 5/2013 |
| JP | 2015-181082 | A | 10/2015 |
| JP | 2016-531020 | A | 10/2016 |
| JP | 2017-220628 | A | 12/2017 |
| JP | 2019-018399 | A | 2/2019 |
| JP | 6511577 | B1 | 5/2019 |
| WO | 2009/020243 | A1 | 2/2009 |
| WO | 2015/009938 | A1 | 1/2015 |
| WO | 2015/080295 | A1 | 6/2015 |

OTHER PUBLICATIONS

International Search Report for PCT/JP2020/036861, mailed Dec. 15, 2020, and English Translation submitted herewith (5 pages).

* cited by examiner

HOLDING TOOL AND MANUFACTURING METHOD

CROSS-REFERENCE TO RELATED APPLICATIONS

This application is a U.S. national phase application filed under 35 U.S.C. § 371 of International Application Number PCT/JP2020/036861, filed Sep. 29, 2020, designating the United States, which claims priority from Japanese Application Number 2019-181173, filed Oct. 1, 2019.

FIELD OF THE INVENTION

The present invention relates to a holding tool and a manufacturing method.

BACKGROUND OF THE INVENTION

A semiconductor wafer (hereinafter, also referred to as a substrate) on which many semiconductor chips are formed is divided into individual semiconductor chips by a dicing device. This division is implemented as follows. The substrate is first held (fixed) by a holding tool. The holding tool is, for example, an annular frame that is several cm larger than the diameter of the substrate. The substrate is fixed to a central opening (holding portion) of the annular frame (holding tool) by a dicing tape. The holding tool on which the substrate is held is mounted on a chuck table of the dicing device. A dicing blade of the dicing device then rotates at high speed, and the substrate is divided. Individual semiconductor chips (IC, LSI, and the like) are obtained through this division. An example of the dicing device is disclosed in JP 2008-300555 A. An example of the holding tool (annular frame: dicing frame) is disclosed in JP 2008-300555 A.

Several other holding tools (annular frames: dicing frames) have also been proposed. JP 2013-106021 A discloses a dicing frame having a flexural modulus (ASTM D790) of 25 GPa or more. JP 2017-220628 A discloses a dicing frame having a flexural strength of a core layer of 200 MPa or more and a flexural modulus of 35 GPa or more.

JP 2000-301451 A proposes a polishing device carrier (a polishing device carrier provided with a workpiece holding hole for holding a workpiece, wherein at least a region including a peripheral edge portion of the workpiece holding hole is configured such that glass fibers impregnated with resin are concentrically oriented).

CITATION LIST

Patent Document

Patent Document 1: JP 2008-300555 A
Patent Document 2: JP 2013-106021 A
Patent Document 3: JP 2017-220628 A
Patent Document 4: JP 2000-301451 A

SUMMARY OF THE INVENTION

Patent Documents 1 to 3 are merely proposals in which physical property values such as the mechanical strength of a dicing frame are stipulated. Patent Documents 1 to 3 do not propose specific configurations of the dicing frames having such physical property values.

Patent Document 4 discloses the following content. When a surface of a workpiece (such as a semiconductor wafer) is to be polished, the workpiece is sandwiched by a pair of upper and lower surface plates while being held by a thin plate-shaped carrier. A polishing solution is supplied to a polishing surface while the carrier is subjected to planetary motion. Lapping (polishing) is then implemented with a polishing cloth attached to the clamping surface of each of the surface plates. At this time, the ends of the fibers that intersect in a direction substantially orthogonal to an inner circumferential surface of the workpiece holding hole formed in the carrier are exposed, and sharp edges are formed. As a result, scratches are easily formed in the outer circumferential surface of the workpiece held in the workpiece holding hole during polishing. Wear also easily occurs. The scratches (and/or wear) reduce the quality of the workpiece, and product value is also reduced. In particular, when the workpiece is a semiconductor wafer, particles are easily formed from the surface roughened by the scratches (wear). This also greatly reduces the production yield of ICs (LSIs or the like). The purpose of invention disclosed in Patent Document 4 is to provide a carrier that solves the above-mentioned problems (namely, suppresses the scratches (and/or wear) that occur during polishing of an outer circumferential end surface of a thin plate-shaped workpiece). Patent Document 4 does not disclose details regarding mechanical strength and the like of the carrier.

A first problem to be solved by the present invention is to propose a holding tool that satisfies preferable physical properties.

A second problem to be solved by the present invention is to propose a holding tool that satisfies the physical property of a flexural modulus in the circumferential direction of 45 GPa or more.

A third problem to be solved by the present invention is to propose a holding tool that satisfies the physical property of warpage of not more than 0.5 mm.

A fourth problem to be solved by the present invention is to propose a holding tool that is not easily electrostatically charged (easily discharges static electricity).

A fifth problem to be solved by the present invention is to propose a lightweight holding tool.

The present invention proposes a holding tool configured using carbon fibers and a resin, wherein
    the holding tool:
    has a substantially annular shape;
    is equipped with a substrate holding portion; and
    is equipped with a first resin layer, and
    in the first resin layer, a longitudinal direction of the fibers is aligned along a circumferential direction of the substantially annular shape.

The present invention proposes a holding tool configured using electrically conductive fibers and a resin, wherein
    the holding tool:
    has a substantially annular shape;
    is equipped with a substrate holding portion; and
    is equipped with a first resin layer, and
    in the first resin layer, a longitudinal direction of the fibers is aligned along a circumferential direction of the substantially annular shape.

The present invention proposes a holding tool configured using fibers and a resin, wherein
    the holding tool:
    has a flexural modulus in a circumferential direction of 45 GPa or more;
    has a substantially annular shape;
    is equipped with a substrate holding portion; and
    is equipped with a first resin layer, and

in the first resin layer, a longitudinal direction of the fibers is aligned along the circumferential direction of the substantially annular shape.

The present invention proposes the abovementioned holding tool, wherein, preferably, the holding tool is further equipped with a second resin layer, and in the second resin layer, the longitudinal direction of the fibers is aligned along a direction intersecting the circumferential direction of the substantially annular shape.

The present invention proposes the abovementioned holding tool, wherein the holding tool preferable includes one or more layers of the first resin layer and one or more layers of the second resin layer.

The present invention proposes the abovementioned holding tool, wherein a surface layer of the holding tool is preferably the first resin layer.

The present invention proposes the abovementioned holding tool, wherein the first resin layer and the second resin layer are preferably laminated.

The present invention proposes the abovementioned holding tool, wherein the first resin layer and the second resin layer are preferably laminated and provided such that the first resin layer and the second resin layer are vertically symmetrical, with a center of the symmetry being a virtual plane located in the middle in a thickness direction of the holding tool.

The present invention proposes the abovementioned holding tool, having at least a layered configuration of, for example, the first resin layer, the second resin layer, and the first resin layer, in this order.

The present invention proposes the abovementioned holding tool, having at least a layered configuration of, for example, the first resin layer, the second resin layer, the second resin layer, and the first resin layer, in this order.

The present invention proposes the abovementioned holding tool, having at least a layered configuration of, for example, the first resin layer, the second resin layer, the first resin layer, the second resin layer, and the first resin layer, in this order.

The present invention proposes the abovementioned holding tool, having at least a layered configuration of, for example, the second resin layer, the first resin layer, and the second resin layer, in this order.

The present invention proposes the abovementioned holding tool, having at least a layered configuration of, for example, the second resin layer, the first resin layer, the first resin layer, and the second resin layer, in this order.

The present invention proposes the abovementioned holding tool, wherein the first resin layer includes fibers having a length of preferably 3 mm or more in the longitudinal direction.

The present invention proposes the abovementioned holding tool, wherein the second resin layer includes fibers having a length of preferably 3 mm or more in the longitudinal direction.

The present invention proposes the abovementioned holding tool, wherein the fibers are preferably electrically conductive fibers.

The present invention proposes the abovementioned holding tool, wherein the fibers are preferably carbon fibers.

The present invention proposes the abovementioned holding tool, wherein the substrate is, for example, a semiconductor wafer.

The present invention proposes the abovementioned holding tool, wherein the flexural modulus of the holding tool in a circumferential direction is preferably 50 GPa or more.

The present invention proposes the abovementioned holding tool, wherein warpage of the holding tool is preferably not more than 0.5 mm.

The present invention proposes the abovementioned holding tool, wherein the weight is 100 g or less.

The present invention proposes the abovementioned holding tool, wherein the thickness is 5 mm or less.

The present invention proposes a method for manufacturing a holding tool, the method including a first 3D printing step, the first 3D printing step including:

forming a physical object with a 3D printer using fibers and a resin, and the forming a physical object is implemented along a substantially annular direction.

The present invention proposes a method for manufacturing a holding tool, the method including a second 3D printing step, the second 3D printing step including:

forming a physical object with a 3D printer using fibers and a resin, and the forming a physical object is implemented along a direction intersecting the substantially annular direction.

The present invention proposes a method for manufacturing a holding tool, the method preferably including the abovementioned first 3D printing step and the abovementioned second 3D printing step.

The present invention proposes the abovementioned method for manufacturing a holding tool, the method preferably including a compressing step including compressing a resin layer formed through the abovementioned 3D printing step(s).

The present invention proposes the abovementioned method for manufacturing a holding tool, wherein the temperature when compressing in the compressing step is preferably from 60 to 500° C.

The present invention proposes a method for manufacturing a holding tool, wherein the method preferably includes a cutting step.

The manufacturing method is a method for manufacturing the abovementioned holding tool.

A holding tool satisfying favorable physical properties is proposed.

The holding tool of claim 3 satisfies the physical property of a flexural modulus in the circumferential direction of 45 GPa or more. Patent Document 4 proposes a polishing device carrier in which glass fibers are concentrically oriented. However, Patent Document 4 does not indicate that the flexural modulus is improved in the case in which the fibers are oriented concentrically. In particular, there is no disclosure in Patent Document 4 that would indicate that a flexural modulus of 45 GPa or more can be achieved.

When the fibers are electrically conductive fibers such as carbon fibers or metal fibers, static electricity is not easily accumulated on the holding tool. In this case, because the holding tool is not easily electrostatically charged, dust and dirt do not easily adhere and do not easily cause problems during processing of the held substrate.

When carbon fibers are used, a lightweight holding tool is obtained.

The holding tool of claim 15 satisfies the physical property of a flexural modulus in the circumferential direction of 50 GPa or more.

The holding tool of claim 16 satisfies the physical property of warpage of not more than 0.5 mm.

The holding tool is easily obtained. When the holding tool is formed using a 3D printer, material loss is low, and costs are inexpensive.

When the holding tool of the present invention is used in a semiconductor manufacturing process made up of multiple steps, warpage of the substrate due to heating or processing is suppressed, positional accuracy and processing accuracy during conveyance are improved, and storage in a carrier for conveyance is facilitated. Furthermore, because the holding tool is lightweight, the load during conveyance is reduced.

DESCRIPTION OF EMBODIMENTS

Figure 1:
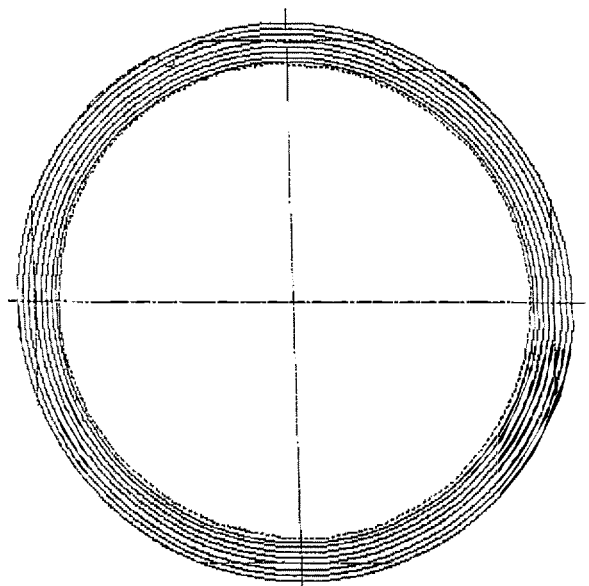
FIG. 1 is a schematic view illustrating a direction of fibers contained in a first resin layer.

Embodiments of the present invention are described.

The first invention is a holding tool. The holding tool is also referred to as a support member. The holding tool is also referred to as a frame for fixing a workpiece. The holding tool is also referred to as, for example, a holding tool for a substrate (for example, a semiconductor wafer). The holding tool is also referred to as a wafer ring, for example. The holding tool is used during a cutting step (dicing step) of the substrate (for example, a semiconductor wafer). When used during the dicing step, the holding tool is also referred to as a dicing frame. Alternatively, the holding tool is used during a conveyance (transport) step. The holding tool may also be used in other applications (steps). For example, the holding tool can be used in a film forming step, a heat treatment step, an inspection step, a back metal step, a cleaning step, a wafer lapping step, a photolithography step, an oxidation-diffusion-CVD-ion implantation step, or a CMP step.

The holding tool is configured using fibers and a resin. Components other than the fibers and resin may be included. The holding tool is substantially annular in a plan view. The term substantially annular indicates that the outer edge shape and/or the inner edge shape is substantially circular. "Substantially circular" means that the shape may also be a shape other than a perfect circle in a mathematical sense. The term "substantially annular shape" means that the outer edge shape and/or the inner edge shape may be substantially quadrangular. The outer edge shape and/or the inner edge shape may also be substantially elliptical. Another shape may also be used. Generally, the holding tool is substantially circular. The shape may be a known shape. The substantially annular shape may be a shape disclosed in, for example, JP 2008-300555 A, JP 2013-106021 A, or JP 2017-220628 A. Of course, the present invention is not limited to such shapes. The shape may be a shape proposed hereafter. Because the holding tool is substantially annular, the holding tool is also referred to as an annular frame.

The holding tool includes a holding portion. For example, a holding portion for a substrate is provided. The arrangement position of the substrate (for example, a semiconductor wafer) is, for example, an inner side of the annular shape (for example, a central opening). In this case, a space inside the annular shape is a substrate holding portion (for example, a semiconductor wafer holding portion). The arrangement position of the substrate (for example, a semiconductor wafer) may be directly above the annular shape. Other arrangement positions may also be adopted. The arrangement may be a general arrangement, and may be an arrangement proposed hereafter.

The holding tool (the substantially annular portion) includes a first resin layer. The first resin layer contains fibers. The fiber length is preferably 3 mm or longer, more preferably 5 mm or longer, and most preferably 10 mm or longer. The fibers are further preferably fibers having a length of at least equal to or more than a circumferential dimension of the substantially annular portion. There is no particular limitation on the upper limit of the length. The fiber length is defined as described above from the perspective of improving the mechanical strength (for example, the flexural modulus) of the holding tool. The fiber length is the weight average fiber length. The average fiber diameter of the fibers is preferably 3 μm or more, more preferably 4 μm or more, and even more preferably 5 μm or more. The average fiber diameter is also preferably 50 μm or less, and more preferably 20 μm or less. The average fiber diameter is the diameter of a single fiber.

The fibers included in the first resin layer are present such that the longitudinal direction of the fibers runs along the circumferential direction of the substantially annular shape (refer to FIG. 1). Of course, it is sufficient that fibers having a longitudinal direction aligned along the circumferential direction of the annular shape be included. The fibers may be aligned in a spiral. "Aligned along the circumferential direction of the substantially annular shape" has a meaning including a "aligned in a spiral shape". Overall, the fibers may be aligned "along the circumferential direction" or a "spiral shape", but some of the fibers may be aligned in a zigzag manner. Not all of the fibers need be aligned along the circumferential direction of the annular shape. That is, 50 mass % or more (more preferably 70 mass % or more, and even more preferably 90 mass % or more) of the fibers need only be aligned along the circumferential direction of the annular shape. If a below-described 3D printing technique is adopted, 95 mass % or more of the fibers are aligned along the circumferential direction of the annular shape (in a spiral shape, for example). In order for 90 mass % or more of all of the fibers to be aligned along the circumferential direction of the annular shape, it is important that the below-described 3D printing technique be adopted.

Any resin (plastic) may be used as long as the resin is a resin (matrix resin) that can be used in a 3D printing step (additive manufacturing technique). A thermoplastic resin may be used. A thermosetting resin may be used. Either one may be used alone, or these resins may be used in combination. The resin may be one type or two or more types. The resin may be in the form of a film (or a sheet). Further, the resin may be in the form of fibers (yarns or filaments). When the resin is in the form of fibers, the resin is a so-called commingled yarn (for example, refer to WO 2016/167136 A1). In the case of a commingled yarn, the technology disclosed in WO 2016/167136 A1 can be employed. The resin preferably has a functional group (reactive group: polar group). Resins not having a functional group (reactive group: polar group) can also be used.

The thermoplastic resin may be a resin constituted of only a thermoplastic resin, or may be a resin containing the thermoplastic resin as a main component. In the present invention, a thermoplastic resin according to either of these cases may be used. Unless otherwise specified, the term "thermoplastic resin" includes both the case in which the resin is constituted of only a thermoplastic resin, and the case in which the resin contains a thermoplastic resin as a main component. Using the thermoplastic resin as a main component means that the thermoplastic resin accounts for 50 mass % or more. The thermoplastic resin preferably accounts for 80 mass % or more, and more preferably accounts for 90 mass % or more.

The thermosetting resin may be a resin constituted of only a thermosetting resin, or may be a resin containing the thermosetting resin as a main component. In the present invention, a thermosetting resin according to either of these cases may be used. Unless otherwise specified, the term "thermosetting resin" includes both the case in which the resin is constituted of only a thermosetting resin, and the case in which the resin contains a thermosetting resin as a main component. Using the thermosetting resin as a main component means that the thermosetting resin accounts for 50 mass % or more. The thermosetting resin preferably accounts for 60 mass % or more, more preferably 70 mass % or more, and even more preferably 80 mass % or more. The thermosetting resin may also account for 90 mass % or more, 95 mass % or more, or 99 mass % or more.

Examples of the thermosetting resin include epoxy resins, vinyl ester resins, unsaturated polyester resins, diallyl phthalate resins, phenolic resins, maleimide resins, bismaleimide resins, cyanate resins, benzoxazine resins, dicyclopentadiene resins. Acrylic resins, and urethane acrylate resins.

Examples of thermoplastic resins include polyolefin resins, polystyrene resins, thermoplastic polyamide resins, polyester resins, polyacetal resins (polyoxymethylene resins), polycarbonate resins, (meth)acrylic resins, polyarylate resins, polyphenylene ether resins, polyamide resins, polyimide resins, polyether nitrile resins, phenoxy resins, polyphenylene sulfide resins, polysulfone resins, polyketone resins, polyetherketone resins, thermoplastic urethane resins, fluororesins, and thermoplastic polybenzimidazole resins.

Examples of the polyolefin resin include polyethylene resins, polypropylene resins, polybutadiene resins, polymethylpentene resins, vinyl chloride resins, vinylidene chloride resins, vinyl acetate resins, and polyvinyl alcohol resins.

Examples of the polystyrene resin include polystyrene resins, acrylonitrile-styrene resins (AS resins), and acrylonitrile-butadiene-styrene resins (ABS resins).

When the thermoplastic resin is formed from two or more types of resin components, the difference between the solubility parameter (SP) values of the two or more types of thermoplastic resins is preferably 3 or less, respectively. Examples of the polyester resin include polyethylene terephthalate resin, polyethylene naphthalate resin, polybutylene terephthalate resin, polytrimethylene terephthalate resin, and liquid crystal polyester. Examples of the (meth) acrylic resin include polymethyl methacrylate. Examples of the modified polyphenylene ether resin include modified polyphenylene ethers and the like. Examples of the thermoplastic polyimide resin include thermoplastic polyimide, polyamide-imide resin, and polyetherimide resin. Examples of the polysulfone resin include modified polysulfone resins, and polyether sulfone resins. Examples of the polyetherketone resin include polyether ketone resin, polyether ether ketone resin, and polyether ketone ketone resin. Examples of the fluororesin include polytetrafluoroethylene, and the like.

The fibers may be any type of material as long as the material improves mechanical strength. Examples thereof include inorganic fibers. Organic fibers may also be used. Metal fibers may also be used. Examples of inorganic fibers include carbon fibers, silicon carbide fibers, alumina fibers, boron fibers, and glass fibers. However, the inorganic fibers are not limited thereto. The fibers are particularly preferably electrically conductive fibers. This is because when electrically conductive fibers are adopted, the holding tool is not easily electrostatically charged. Furthermore, even if the holding tool is electrostatically charged, the static electricity is easily discharged. As a result, problems do not easily occur during processing of the substrate (semiconductor wafer) held by the holding tool. Examples of the electrically conductive fibers include carbon fibers, fibers formed from an electrically conductive polymer, and metal fibers. The most preferred electrically conductive fibers are carbon fibers. When carbon fibers are used, the holding tool is lightweight.

Examples of the carbon fibers include polyacrylonitrile (PAN) based carbon fibers, petroleum/coal pitch-based carbon fibers, rayon-based carbon fibers, cellulose-based carbon fibers, lignin-based carbon fibers, phenol-based carbon fibers, and vapor phase growth-based carbon fibers. Among these, one or more types may be used, as appropriate. The carbon fibers preferably have a tensile elastic modulus from 100 GPa to 1000 GPa. The form of the carbon fibers is not particularly limited. The carbon fibers may be in a form of continuous or discontinuous fibers. Examples of continuous fibers include those in which carbon fibers are arranged in one direction (unidirectional material). When discontinuous fibers are used, examples include materials arranged so that the carbon fibers are oriented in a specific direction in the resin, and materials in which the carbon fibers are randomly dispersed and arranged in an in-plane direction in the resin. The carbon fiber may be a single fiber, a fiber bundle, or a mixture of both. Carbon fibers are generally in the form of a fiber bundle in which thousands to tens of thousands of filaments are assembled. For a case in which a carbon fiber bundle is used as the carbon fibers, when the carbon fiber bundle is used as is, the entangled portion of the fiber bundle becomes locally thick, which may make it difficult to obtain a carbon-fiber-reinforced resin workpiece having a thin-walled end surface. Therefore, when a carbon fiber bundle is used as the carbon fibers, the carbon fiber bundle is preferably widened or opened, and then used.

Examples of the metal fibers include Al fibers, Au fibers, Ag fibers, Fe fibers, Cu fibers, and stainless steel fibers.

Examples of organic fibers include aramid fibers, aromatic polyamide fibers, cellulose fibers, polyethylene fibers, and poly(paraphenylene benzobisoxaxole) fibers (Zylon (available from Toyobo Co., Ltd.)).

The fibers may be treated with a treatment agent. Examples of the treatment agent include a sizing agent. Another example is a surface treatment agent. Examples thereof include the treatment agents disclosed in JP 4894982 B. It is advantageous for the treatment agent on the fiber surface to react with a functional group (reactive group: polar group) of the resin. The treatment agent is selected from the group consisting of, for example, epoxy resins, urethane resins, silane coupling agents, water-insoluble polyamide resins, and water-soluble polyamide resins. The treatment agent is preferably selected from the group consisting of epoxy resins, urethane resins, water-insoluble polyamide resins, and water-soluble polyamide resins. A single type of treatment agent may be used, or two or more types may be combined and used. A known method can be adopted as the treatment method using the treatment agent. For example, the fibers may be immersed in a treatment agent solution. Through this, the treatment agent adheres to the fiber surface. A technique for air blowing a treatment agent onto the surface of the fibers can also be used. Fibers that have already been treated with a surface treatment agent (or a treatment agent) may also be used. Commercially available fibers to which the surface treatment agent (or treatment agent) is adhered may be washed, and a surface treatment agent (or treatment agent) may be once again adhered thereto.

Commingled yarn (mixed fibers) may be used. A preferable resin used in the commingled yarn is a thermoplastic resin. Examples of thermoplastic resins include polyolefin resins (for example, polyethylene, and polypropylene), polyamide resins, polyester resins (for example, polyethylene terephthalate, and polybutylene terephthalate), polycarbonate resins, polyoxymethylene resins, polyether ketones, polyether sulfones, and thermoplastic polyether imides. The resin is preferably a polyamide resin. The thermoplastic resin composition may include an elastomer component. Examples of the elastomer component include polyolefin-based elastomers, diene-based elastomers, polystyrene-based elastomers, polyamide-based elastomers, polyester-based elastomers, polyurethane-based elastomers, fluorine-based elastomers, and silicon-based elastomers. The elastomer component is preferably a polyolefin-based elastomer or a polystyrene-based elastomer. Modified elastomers modified by an $\alpha,\beta$-unsaturated carboxylic acid and acid anhydrides thereof, acrylamide and derivatives thereof, or the like in the presence (or absence) of a radical initiator are also preferable. These elastomers are used to impart miscibility with the polyamide resin. When an aforementioned elastomer is used, the blended amount of the elastomer component is preferably from 5 to 25 mass % of the thermoplastic resin composition. The proportion of the resin in the commingled yarn is preferably 30 mass % or more. The proportion thereof is also preferably not more than 70 mass %, and is more preferably not more than 60 mass %. In some cases, the proportion thereof may be not more than 40 mass %. In the case of the commingled yarn, preferably, reinforcing fibers (for example, carbon fibers) having a length more than 30 mm and thermoplastic resin fibers are contained. In the case of the commingled yarn, the dispersibility is preferably from 60 to 100%, is more preferably 65% or more, and is even more preferably 70% or more. In such a range, the commingled yarn exhibits more uniform physical properties, the appearance of a formed body is improved, and the mechanical properties of the formed body are favorable. The thermoplastic resin fibers are so-called continuous thermoplastic resin fibers. The length is set as appropriate. One example is thermoplastic resin fibers having a fiber length of more than 30 mm. An example of an upper limit of the fiber length is 20000 m.

The holding tool preferably includes a second resin layer in addition to the first resin layer. The second resin layer contains fibers. The resin and fibers used in the configuration of the second resin layer can be the resin and fibers described with regard to the first resin layer. The resin and fibers used in the configuration of the second resin layer may be the same as or different from the resin and fibers used in the configuration of the first resin layer. The resin and fibers are preferably the same types as those of the first resin layer, and are more preferably the same as those of the first resin layer. The same commingled yarn may be used. The length of the fibers included in the second resin layer may be shorter than the length of the fibers included in the first resin layer. However, the fibers thereof may also be around the same length. The fiber length is preferably 3 mm or longer, more preferably 5 mm or longer, and most preferably 10 mm or longer. There is no particular limitation on the upper limit of the length. The fiber length is the weight average fiber length. The average fiber diameter of the fibers is preferably 3 µm or more, more preferably 4 µm or more, and even more preferably 5 µm or more. The average fiber diameter is also preferably 50 µm or less, more preferably 20 µm or less, and even more preferably 12 µm or less. The average fiber diameter is the diameter of a single fiber.

Figure 2:
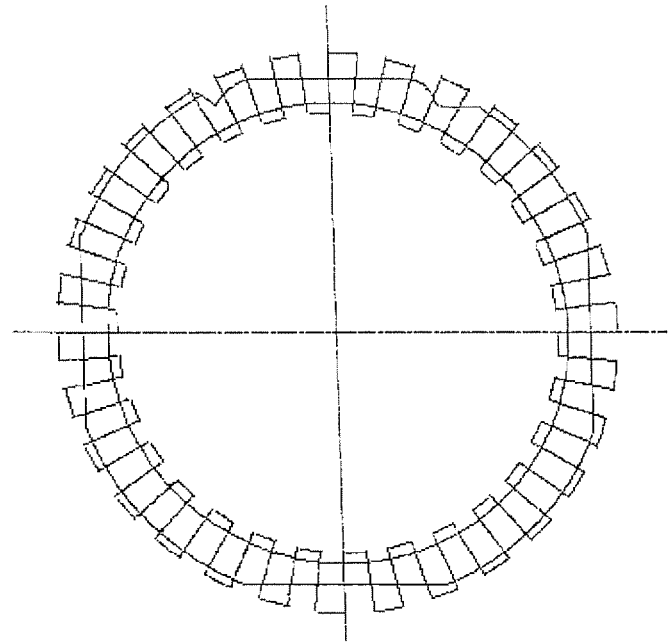
FIG. 2 is a schematic view illustrating the direction of fibers contained in a second resin layer.

The fibers included in the second resin layer are present such that the longitudinal direction of the fibers runs along a direction intersecting the circumferential direction of the substantially annular shape (refer to FIG. 2). When the annular shape is circular, the intersecting direction is, for example, a radial direction (radial vector direction). The intersecting direction can also be said to be a radiating direction. The intersecting direction may also be inclined in relation to the radial direction (radial vector direction: radiating direction). For example, the intersecting direction may be inclined at an angle within a range of +45°. Of course, the intersecting direction is preferably the radial direction (radial vector direction: radiating direction). The fibers included in the second resin layer have folded portions (U-shaped portions, inverted U-shaped portions) (refer to FIG. 2).

The holding tool includes one or more layers of the first resin layer and one or more layers of the second resin layer. The first resin layer and the second resin layer are laminated, for example. The first resin layer and the second resin layer are preferably laminated such that the first resin layer and the second resin layer are vertically symmetrical, with a center of the symmetry being a virtual plane located in the middle in a thickness direction of the holding tool (with the thickness direction being the vertical direction).

The laminated configuration of the first resin layer and the second resin layer is provided with a layered configuration of at least, for example, the second resin layer, the first resin layer, and the second resin layer. The laminated configuration may also be, for example, a three-layer configuration of the second resin layer, the first resin layer, and the second resin layer. Alternatively, the laminated configuration may be provided with a layered configuration of at least the first resin layer, the second resin layer, and the first resin layer. For example, the laminated configuration may be a three-layer configuration of the first resin layer, the second resin layer, and the first resin layer. Alternatively, the laminated configuration may be provided with a layered configuration of at least the second resin layer, the first resin layer, the first resin layer, and the second resin layer. For example, the laminated configuration may be a four-layer configuration of the second resin layer, the first resin layer, the first resin layer, and the second resin layer. In this layered configuration, the layering of the first resin layer and another of the first resin layer can also be considered to be a single first resin layer. In this case, the configuration of the second resin layer, the first resin layer, the first resin layer, and the second resin layer can also be referred to as a three-layer configuration of the second resin layer, the first resin layer, and the second resin layer. Alternatively, the laminated configuration may be provided with a layered configuration of at least the first resin layer, the second resin layer, the second resin layer, and the first resin layer. For example, the laminated configuration may be a four-layer configuration of the first resin layer, the second resin layer, the second resin layer, and the first resin layer. The layering of the second resin layer and another of the second resin layer can also be considered to be a single second resin layer. In this case, the configuration of the first resin layer, the second resin layer, the second resin layer, and the first resin layer can also be referred to as a three-layer configuration of the first resin layer, the second resin layer, and the first resin layer. Alternatively, the laminated configuration may be provided with a layered configuration of at least the first resin layer, the second resin layer, the first resin layer, and the second resin layer. For example, the laminated configuration may be a five-layer configuration of the first resin layer, the second resin layer, the first resin layer, the second resin layer, and the first resin layer.

The laminated configuration means that, for example, a main surface of the second resin layer (surface with a maximum surface area) is provided on a main surface of the first resin layer (surface with a maximum surface area).

Better surface flatness is exhibited when the first resin layer is present on the surface than when the second resin layer is present on the surface. A special coating layer need not be provided on the surface.

The thickness of the first resin layer is preferably 0.1 mm or more, more preferably 0.2 mm or more, and even more preferably 0.3 mm or more. The thickness of the first resin layer is also preferably not more than 1 mm, more preferably not more than 0.8 mm, and more preferably not more than 0.6 mm.

The thickness of the second resin layer is preferably 0.1 mm or more, more preferably 0.2 mm or more, and even more preferably 0.3 mm or more. The thickness of the second resin layer is also preferably not more than 1 mm, more preferably not more than 0.8 mm, and more preferably not more than 0.6 mm.

The flexural modulus (flexural modulus in the circumferential direction (measured in accordance with JIS K7074)) of the holding tool is preferably approximately 45 GPa or more, more preferably 50 GPa or more, even more preferably 55 GPa or more, and particularly preferably 60 GPa or more. The flexural modulus is very large.

The weight of one of the holding tools is preferably not more than 100 g, more preferably not more than 50 g, and particularly preferably not more than 30 g. The weight of one of the holding tools is also preferably 1 g or more. Thus, the holding tool is very lightweight.

The thickness of the holding tool is preferably not more than 5 mm, more preferably not more than 3 mm, and particularly preferably not more than 1.5 mm. The thickness thereof is also preferably 0.1 mm or more.

The warpage of the holding tool is preferably not more than 0.5 mm, more preferably not more than 0.4 mm, and even more preferably not more than 0.3 mm. There are also cases in which no warpage is observed, and the holding tool is very flat.

The coefficient of linear expansion of the holding tool is preferably not more than 10 ppm/° C., more preferably not more than 8 ppm/° C., and particularly preferably not more than 5 ppm/° C. Thus, the coefficient of linear expansion is very small.

The second invention is a method for manufacturing a holding tool. For example, the method is a method for manufacturing the holding tool described above. The method includes a first 3D printing step. The first 3D printing step is a step in which a physical object is formed with a 3D printer using fibers and a resin. The forming a physical object is implemented in a substantially annular direction. The longitudinal direction of the fibers of the holding tool obtained in this manner is oriented in the substantially annular direction (refer to FIG. 1). Therefore, fluctuation of the mechanical properties of the holding tool are small even with differences in positions along the substantially annular direction.

The method includes a second 3D printing step. The second 3D printing step is a step in which a physical object is formed with a 3D printer using fibers and a resin. The manufacturing is implemented in a direction intersecting the substantially annular direction. The longitudinal direction of the fibers of the holding tool obtained in this manner is, for example, oriented in a radial vector direction (refer to FIG. 2). Therefore, warpage of the holding tool is small.

The method preferably includes the first 3D printing step and the second 3D printing step.

If the method includes the first 3D printing step and the second 3D printing step, either step may be implemented first. If the next 3D printing step is implemented following the initial 3D printing step, the resin layers are in a laminated form. Alternatively, each resin layer may be laminated after each layer is obtained. However, preferably, the next 3D printing step is implemented on the resin layer obtained in the first 3D printing step such that the resin layers are laminated. It can be understood that this is preferred for the integrity of the resin layers.

Figure 3:
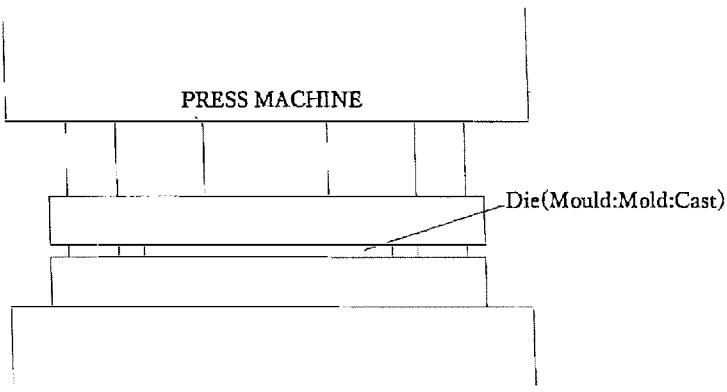
FIG. 3 is a schematic view of a compressing step of the holding tool.

The method preferably includes a compressing step. The compressing step is a step in which a resin layer formed through the 3D printing step(s) is compressed (refer to FIG. 3). The temperature when compressing in the compressing step is preferably from 60 to 500° C. (more preferably 90° C. or higher).

Figure 4:
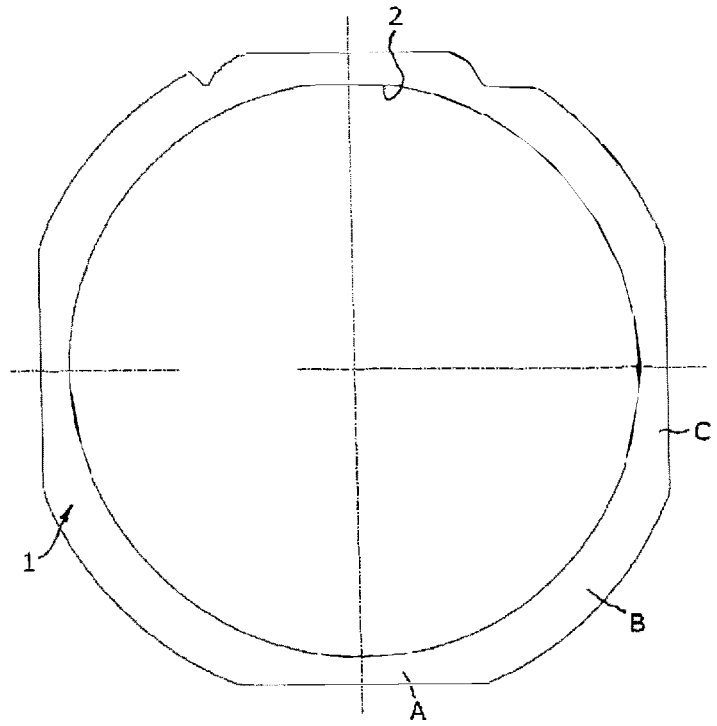
FIG. 4 is a plan view of the holding tool.

The method preferably includes a cutting step. In the cutting step, the holding tool is shaped as desired (refer to FIG. 4). For example, the outer shape and the inner shape of a base having a substantially annular shape are formed into a desired shape. In FIG. 4, 1 is a holding tool, and 2 is a central opening. The central opening 2 is a holding portion for a substrate.

The 3D printer is technology known in additive manufacturing. This technology is described as follows in the "FY2013 Patent Application Technical Trend Survey (Summary), 3D Printers". 3D printer generation technology (additive manufacturing technology) refers to a process of creating an object from a numerical representation of a three-dimensional shape by adhering materials. Often, this process is achieved by stacking a layer onto another layer. The representation of a 3D printer is used from a two-dimensional contrast output onto paper. In ASTM F2792-12a (Standard Terminology for Additive Manufacturing Technologies), the term additive manufacturing is used. The 3D printing step is a step in which a physical object is formed with a 3D printer using fibers and a resin (this expression includes commingled yarn). An example of the 3D printing step includes the following example. For example, the 3D printing step may be a step in which fibers and a resin are used and an object is formed by a hot melt lamination method using an additive manufacturing device (a 3D printer) equipped with a nozzle. However, the 3D printing step is not limited thereto. The forming method includes a compressing step. The compressing step is a step of compressing the formed object. The formed object is a modeled object obtained through the 3D printing step. In the 3D printing step, a resin (plastic) and fibers are used. In the aforementioned step, the resin (resin serving as a matrix) and the fibers may be supplied (discharged) from separate nozzles. Each material may be supplied (discharged) simultaneously. Alternatively, the materials may be supplied (discharged) with a time difference. A fiber-reinforced plastic material (material in which fibers are dispersed in a resin: commingled yarn) may be supplied (discharged) from one nozzle.

The product obtained in the 3D printing step may be preformed in some cases, prior to the compressing step. Through the preforming, a product having a shape close to that of the finished product is obtained. Of course, preforming may be unnecessary in some cases. Here, the preforming is formation implemented between the 3D printing step and the compressing step. The product (fiber-reinforced plastic product) obtained in this step preferably has fibers dispersed in a plastic (matrix resin) in the product. Preferably, a 3D printing step is implemented such that the fibers are dispersed in the plastic (resin). The 3D printing step may be implemented under known conditions. Alternatively, special conditions may be used.

The compressing step is a step in which the product obtained in the 3D printing step (preformed product if a preforming step is included) is compressed. For example, the compressing step is a step in which the product obtained in the 3D printing step (preformed product if a preforming step is included) is placed into a mold (for example, a die) of a predetermined shape and compressed. For example, the compressing step is a step in which the product obtained in the 3D printing step (preformed product if a preforming step is included) is placed into a mold of a predetermined shape and compressed. The temperature of the product (formed object) during the compressing step is as described above. Heating may be implemented during this step, or may be implemented prior to this step. However, heating when compressing actually results in large heat loss. Therefore, heating is preferably implemented before compressing. The compressing step is preferably implemented under conditions (pressure) of 1 kPa or more, more preferably 5 kPa or more, and further preferably $1.0\times10^2$ kPa or more. The compressing step is also preferably implemented at a pressure of not more than $1.0\times10^6$ kPa, more preferably not more than $5.0\times10^5$ kPa, and further preferably not more than $1.0\times10^5$ kPa. If the pressure is too low, the features of the present inventive are diminished. If the pressure is too high, the degree of improvement of the features does not increase proportionally. If the pressure is too high, costs increase. From details such as these, the pressure is preferably in the range described above. The compressing time is preferably 0.5 seconds or longer, and more preferably 1 second or longer. An improvement in mechanical strength (for example, tensile strength and/or flexural strength) is achieved by implementing the compressing step in comparison to a case in which the compressing step is not implemented. Warpage is also reduced thereby.

Furthermore, various additives (for example, antioxidants, stabilizers such as thermal stabilizers, hydrolysis resistance improving agents, weather resistant stabilizers, matting agents, UV absorbers, nucleating agents, plasticizers, dispersants, flame retardants, antistatic agents, anti-coloration agents, anti-gelling agents, colorants, and release agents) may be included in the holding tool within a scope that does not impair the object and effect of the present invention. The holding tool may also include a filler. However, a filler is preferably not included. Specifically, the content of the filler in the thermoplastic resin composition is preferably 3 mass % or less. Preferably, the holding tool does not contain an inorganic powder (for example, carbon black). The holding tool also does not contain a metal powder. Of course, problems are minimal when a trace amount (for example, 3 mass % or less) is contained. The powder is not preferable for the following reason. The powder can leak out to the surface while the holding tool is in use, and powder that has leaked to the surface can adhere to the surface of the semiconductor wafer.

The present invention will be described in detail below. The following examples are only some examples of the present invention, and the present invention is not limited to the examples described below. Variations and application examples in which the merits of the present invention are not greatly impaired are also included in the present invention.

Example 1

Additive manufacturing (3D printing) was implemented (nozzle temperature: 250° C., stage temperature: 25° C.) using a composite material (commingled yarn: available from Kojirene Inc.) as a raw material and a 3D printer (K8200 available from Velleman).

An annular plate (donut-shaped plate: inner diameter of 250 mm, outer diameter of 295 mm) with a thickness of approximately 0.3 to 0.4 mm was produced by 3D printing. The carbon fibers were oriented substantially along the circumferential direction (refer to FIG. 1). After the above-mentioned 3D printing (first 3D printing) was completed, a second 3D printing was similarly implemented. The annular plate obtained through the second 3D printing was laminated onto the annular plate from the first 3D printing. After the second 3D printing was completed, a third 3D printing was similarly implemented. The annular plate obtained through the third 3D printing was laminated onto the annular plate from the second 3D printing. After the third 3D printing was completed, a fourth 3D printing was similarly implemented. The annular plate obtained through the fourth 3D printing was laminated onto the annular plate from the third 3D printing. The layer configuration of the resulting annular plate was, in the following order, a first resin layer (with the longitudinal direction of the carbon fibers oriented along the circumferential direction (refer to FIG. 1)), a first resin layer (with the longitudinal direction of the carbon fibers oriented along the circumferential direction (refer to FIG. 1)), a first resin layer (with the longitudinal direction of the carbon fibers oriented along the circumferential direction (refer to FIG. 1)), and yet another first resin layer (with the longitudinal direction of the carbon fibers oriented along the circumferential direction (refer to FIG. 1)). This example is called a four-layer laminate. However, because the laminate is made only of first resin layers, the laminate can be considered to be a single layer type.

The laminated annular plate was cut (refer to FIG. 4).

The maximum warpage of this annular plate of a four-layer laminate was 20 mm. In the current state, the annular plate was not suitable for use as a semiconductor wafer holding tool.

Next, pressing (180° C., 2 h, pressure of $1.0\times10^3$ kPa) was implemented. Through this pressing, the maximum warpage was reduced to approximately 0.5 mm.

The flexural modulus of the annular plate (holding tool) in the circumferential direction (measured in accordance with JIS K7074) was approximately 60 GPa. Since carbon fibers were aligned along the circumferential direction, it can be understood that variation in the flexural modulus was small.

The thickness of the annular plate (holding tool) was approximately 1 mm.

The weight of the annular plate (holding tool) was 24 g.

Example 2

Example 2 was implemented in accordance with Example 1 with the exception that the layer structures of Example 2 and Example 1 were different.

First, an annular plate (donut-shaped plate: inner diameter of 250 mm, outer diameter of 295 mm) with a thickness of approximately 0.3 to 0.4 mm was produced by 3D printing (refer to FIG. 1). The carbon fibers were oriented substantially along the circumferential direction (refer to FIG. 1).

After the abovementioned 3D printing (first 3D printing) was completed, a second 3D printing was similarly implemented. The annular plate obtained through the second 3D printing was laminated onto the annular plate from the first 3D printing. The carbon fibers of the annular plate from the second 3D printing were also oriented substantially along the circumferential direction (refer to FIG. 1).

A third 3D printing was implemented. The annular plate obtained through the third 3D printing was laminated onto the annular plate from the second 3D printing. The carbon fibers of the annular plate from the third 3D printing were oriented in the radial direction (radial vector direction) (refer to FIG. 2). The orientation of the carbon fibers was inverted (U-shape, inverted U-shape) at the inner and outer edge sides (refer to FIG. 2).

A fourth 3D printing was implemented. The annular plate obtained through the fourth 3D printing was laminated onto the annular plate from the third 3D printing. The carbon fibers of the annular plate from the fourth 3D printing were also oriented substantially along the circumferential direction (refer to FIG. 1). After the fourth 3D printing was completed, a fifth 3D printing was similarly implemented. The annular plate obtained through the fifth 3D printing was laminated onto the annular plate from the fourth 3D printing. The carbon fibers of the annular plate from the fifth 3D printing were also oriented substantially along the circumferential direction (refer to FIG. 1).

The layer configuration of the resulting annular plate was, in the following order, a first resin layer (with the longitudinal direction of the carbon fibers oriented along the circumferential direction), a first resin layer (with the longitudinal direction of the carbon fibers oriented along the circumferential direction), a second resin layer (the longitudinal direction of the carbon fibers oriented along the radial direction), a first resin layer (with the longitudinal direction of the carbon fibers oriented along the circumferential direction), and yet another first resin layer (with the longitudinal direction of the carbon fibers oriented along the circumferential direction). The laminated annular plate was cut (refer to FIG. 4). Next, pressing (250° C., 10 min, pressure of $1.0 \times 10^3$ kPa pressure) was implemented (refer to FIG. 3).

The this five-layer laminate-type (which can also be regarded as a three-layer laminate type) annular plate (holding tool) had a maximum warpage of 0.3 mm even without a step to correct warpage.

The thickness of the annular plate (holding tool) was approximately 1 mm.

The weight of the annular plate (holding tool) was 27 g.

The flexural modulus of the annular plate (holding tool) in the circumferential direction (measured in accordance with JIS K7074) was approximately 86.5 GPa, and the flexural strength was approximately 1.05 GPa. Since carbon fibers were aligned along the circumferential direction, it can be understood that variation in the flexural modulus was small. The values of the flexural modulus and the flexural strength were the same at position A, position B, and position C illustrated in FIG. 4.

Example 3

Example 3 was implemented in accordance with Example 2.

Benzoxazine (CRP-974, available from Aica Kogyo Co., Ltd.) was used as the resin in Example 3. T800HB-6000 available from Toray Industries, Inc. was used as the carbon fiber. In other words, different materials were used in Example 3 and Example 2.

The thickness of the annular plate (holding tool) obtained in this example was approximately 1 mm.

The weight of the annular plate (holding tool) was 27 g.

The annular plate (holding tool) had a maximum warpage of 0.3 mm.

The flexural modulus of the annular plate (holding tool) in the circumferential direction (measured in accordance with JIS K7074) was approximately 112 GPa, and the flexural strength was approximately 1.98 GPa.

Example 4

Example 4 was implemented in accordance with Example 2.

A naphthol aralkyl-type cyanate resin available from Mitsubishi Gas Chemical Company, Inc. was used as the resin in Example 4. T800HB-6000 available from Toray Industries, Inc. was used as the carbon fiber. In other words, different materials were used in Example 4 and Example 2.

The thickness of the annular plate (holding tool) obtained in this example was 1 mm.

The weight of the annular plate (holding tool) was 27 g.

The annular plate (holding tool) had a maximum warpage of 0.3 mm.

The flexural modulus of the annular plate (holding tool) in the circumferential direction (measured in accordance with JIS K7074) was approximately 102 GPa, and the flexural strength was approximately 1.32 GPa.

The annular plate (holding tool) of Example 2 and the annular plate (holding tool) of the present Example 4 were heated to 200° C., and in this heated state, were then subjected to a bending test (with measurements in accordance with JIS K7074).

After heating, the resin of the annular plate (holding tool) of Example 2 was melted. The flexural modulus in the heated state was approximately 58 GPa, and the flexural strength was approximately 0.20 GPa. These values were compared with bending test results at ordinary temperature, and from the comparison, the retention rate of the flexural modulus was found to be approximately 67%, and the retention rate of the flexural strength was found to be approximately 19%.

No change was observed in the resin of the annular plate (holding tool) of Example 4 after the abovementioned heating. The flexural modulus in the heated state was approximately 82 GPa, and the flexural strength was approximately 1.00 GPa. These values were compared with bending test results at ordinary temperature, and from the comparison, the retention rate of the flexural modulus was found to be approximately 80%, and the retention rate of the flexural strength was found to be approximately 76%.

From these results, it was found that the resin of a holding tool used under high temperature conditions is more preferably a thermosetting resin than a thermoplastic resin.

Reference Example 1

A PAN-based prepreg (250 basis weight) of 300 mm×300 mm laminated to a thickness of 1 mm so as to be symmetrical in the thickness direction was prepared. This prepreg was inserted into an autoclave. The laminate was sandwiched between a release film (fluorine-based resin film) and an aluminum backing plate, and the periphery was covered with a nonwoven fabric and a bagging film.

The laminate was then subjected to autoclave molding (130° C., 2 h, pressure of $3.0 \times 10^2$ kPa pressure, vacuum drawing).

The molded product was removed, and then cut into a predetermined shape (refer to FIG. 4).

Large variations in the flexural modulus and flexural strength in the circumferential direction of the obtained annular plate (holding tool) were observed. The flexural modulus (measured in accordance with JIS K7074) was 89.9 GPa at position A, 17.7 GPa at position B, and 30.1 GPa at position C, the positions A, B, and C being illustrated in FIG. 4. The flexural strength was 1.59 GPa at position A, 0.31 GPa at position B, and 0.68 GPa at position C in FIG. 4.

The weight of the holding tool was 30 g.

The invention claimed is:

1. A holding tool comprising fibers and a resin, wherein the fibers comprise at least one selected from the group consisting of carbon fibers, electrically conductive fibers other than carbon fiber, or combinations thereof, and wherein the holding tool:

has a substantially annular shape;

comprises a substrate holding portion, wherein the substrate is a semiconductor wafer; and comprises a first resin layer, and in the first resin layer, a longitudinal direction of the fibers is aligned along a circumferential direction of the substantially annular shape.

2. The holding tool according to claim 1, wherein the holding tool further comprises a second resin layer, and in the second resin layer, the longitudinal direction of the fibers is aligned along a direction intersecting the circumferential direction of the substantially annular shape.

3. The holding tool according to claim 2, wherein the holding tool comprises one or more layers of the first resin layer and one or more layers of the second resin layer.

4. The holding tool according to claim 2, wherein the first resin layer and the second resin layer are laminated, and are provided such that the first resin layer and the second resin layer are vertically symmetrical, with a center of the symmetry being a virtual plane located in the middle in a thickness direction of the holding tool.

5. The holding tool according to claim 2, comprising at least a layered configuration of the second resin layer, the first resin layer, and the second resin layer, in this order.

6. The holding tool according to claim 2, comprising at least a layered configuration of the first resin layer, the second resin layer, and the first resin layer, in this order.

7. The holding tool according to claim 2, comprising at least a layered configuration of the first resin layer, the second resin layer, the first resin layer, the second resin layer, and the first resin layer, in this order.

8. The holding tool according to claim 2, wherein the second resin layer comprises fibers having a length of 3 mm or more in the longitudinal direction.

9. The holding tool according to claim 1, wherein a surface layer of the holding tool is the first resin layer.

10. The holding tool according to claim 1, wherein the first resin layer comprises fibers having a length of 3 mm or more in the longitudinal direction.

11. The holding tool according to claim 1, wherein a flexural modulus of the holding tool in the circumferential direction is 50 GPa or more.

12. The holding tool according to claim 1, wherein warpage of the holding tool is not more than 0.5 mm.

13. The holding tool according to claim 1, wherein a weight of the holding tool is 100 g or less.

14. The holding tool according to claim 1, wherein a thickness of the holding tool is 5 mm or less.

15. A holding tool configured using fibers and a resin, wherein the holding tool:

has a flexural modulus in a circumferential direction of 45 GPa or more;

has a substantially annular shape;

comprises a substrate holding portion, wherein the substrate is a semiconductor wafer; and comprises a first resin layer, and in the first resin layer, a longitudinal direction of the fibers is aligned along the circumferential direction of the substantially annular shape.

16. The holding tool according to claim 15, wherein the fibers are electrically conductive fibers and/or carbon fibers.

17. A method for manufacturing a holding tool, the method comprising a first 3D printing step, the first 3D printing step including:

forming a physical object with a 3D printer using fibers and a resin, wherein the forming the physical object is implemented along a substantially annular direction, and wherein the holding tool:

comprises carbon fibers and/or electrically conductive fibers, has a substantially annular shape;

comprises a substrate holding portion, wherein the substrate is a semiconductor wafer; and comprises a first resin layer, and in the first resin layer, a longitudinal direction of the fibers is aligned along a circumferential direction of the substantially annular shape.

18. The method according to claim 17, further comprising a second 3D printing step, the second 3D printing step including:

forming a physical object with a 3D printer using fibers and a resin, wherein the forming of the physical object is implemented along a direction intersecting the substantially annular direction.

19. The method according to claim 17, further comprising a compressing step including compressing a resin layer formed through the 3D printing step(s).

20. The method according to claim 19, wherein the temperature when compressing in the compressing step is from 90 to 500° C.

21. The method according to claim 17, further comprising a cutting step.

\* \* \* \* \*